United States Patent [19]

Kawabata

[11] Patent Number: 4,764,798
[45] Date of Patent: Aug. 16, 1988

[54] MASTER SLICE IC HAVING N AND P CHANNEL TRANSISTORS

[75] Inventor: Keiji Kawabata, Hyogo, Japan

[73] Assignee: Mitsubishi Denki Kabushiki Kaisha, Tokyo, Japan

[21] Appl. No.: 817,237

[22] Filed: Jan. 9, 1986

[30] Foreign Application Priority Data

Feb. 7, 1985 [JP] Japan ................................ 60-23264

[51] Int. Cl.⁴ .................... H01L 29/72; H01L 27/10; H01L 27/02
[52] U.S. Cl. ........................................ 357/45; 357/36; 357/42
[58] Field of Search ............................ 357/45, 42, 36

[56] References Cited

FOREIGN PATENT DOCUMENTS

| | | |
|---|---|---|
| 0119059 | 3/1984 | European Pat. Off. . |
| 0131463 | 7/1984 | European Pat. Off. . |
| 0150423 | 12/1984 | European Pat. Off. ............... 357/45 |
| 155563 | 12/1981 | Japan ...................................... 357/42 |
| 127348 | 7/1983 | Japan ...................................... 357/42 |

Primary Examiner—Martin H. Edlow
Assistant Examiner—David R. Josephs
Attorney, Agent, or Firm—Sughrue, Mion, Zinn, Macpeak & Seas

[57] ABSTRACT

A semiconductor integrated circuit device of the master slice type which is suitable for use both in digital and analog circuits. The device includes a plurality of parallel basic elements, each including a plurality of p channel MOS transistors having gate electrodes connected commonly and source and drain regions separated from each other and a plurality of n channel MOS transistors having gate electrodes connected commonly and source and drain regions separated from each other. The source and drain regions of the p and n channel MOS transistors arranged in corresponding positions of the basic elements are common.

3 Claims, 6 Drawing Sheets

MASTER SLICE IC HAVING N AND P CHANNEL TRANSISTORS

BACKGROUND OF THE INVENTION

The present invention relates to a master slice type semiconductor integrated circuit device, specifically, a gate array. More particularly, the invention relates to a novel gate arrangement of such a device.

FIG. 1 shows the arrangement of a conventional semiconductor integrated circuit device of a type in which a unit cell 30 (surrounded by a dotted line) includes gate regions 31a and 31b and source or grain regions 32a and 32b which constitute MOS transistors. The number of MOS transistors in the unit cell 30 can be selected arbitrarily. That is, if the unit cell 30 is to be constituted with four pairs of MOS transistors as shown, adjacent gate regions 311a and 311b, which are essentially identical to the gate regions 31a and 31b, are connected to a positive source potential and a ground potential, respectively, to cut off MOS transistors having and gate regions 311a and 311b, and to thereby isolate the unit cell 30 from the surrounding regions.

FIG. 2 shows an arrangement of a four-input NOR gate in which reference numerals 41 and 42 depict aluminum wiring in first and second layers, respectively. Input signals IN1 to IN4 are supplied through the aluminum wiring 42 in the second layer to gate electrodes 31a of p channel MOS transistors and gate electrodes 31b of n channel MOS transistors, and an output signal is obtained at an output terminal OUT through the aluminum wiring 42. Electrical connection between the MOS transistors of the four-input NOR gate is realized by the aluminum wiring 41 in the first layer. Reference numeral 51 depicts contact holes for connection between the aluminum wiring 41 in the first layer and p or n type source or drain regions 32a and 32b formed on the surface of a semiconductor substrate, 52 connection points between the aluminum wiring 42 in the second layer and the gate regions 31a and 31b, and 53 a connection point between the aluminum wirings 41 and 42.

In the conventional semiconductor device constructed as above, only p and n channel MOS transistors each of a certain constant size can be formed. This may be acceptable when the circuit device is used as a digital circuit component. However, for use as an analog circuit component, it is desirable to have variously sized MOS transistors. In order to realize such variously sized MOS transistors in the conventional circuit device, it may be possible to connect like-sized MOS transistors in series or in parallel. In the latter case, however, the required area of the circuit device becomes too large. In addition thereto, there is a problem of undesired current flows.

SUMMARY OF THE INVENTION

The present invention was made in view of the defects of the conventional semiconductor integrated circuit device, and an object of the invention is to provide a semiconductor integrated circuit device of the master slice type which is suitable for use not only in a digital circuit but also in an analog circuit.

According to the present invention, a plurality of basic elements, each constituted with a plurality of p channel MOS transistors and a plurality of n channel MOS transistors, are provided. The p channel MOS transistors have a common gate electrode and mutually separated source or drain regions. The n channel MOS transistors have a common gate electrode and mutually separated source or drain regions. The basic elements are arranged such that the source or drain regions of the p channel MOS transistors are common and those of the n channel MOS transistors are also common. For a digital circuit application, the source or drain regions of the p channel MOS transistors and those of the n channel MOS transistors are connected commonly such that they constitute a single respective p channel MOS transistor and a single respective n channel MOS transistor as in the conventional manner. For an analog circuit application, any number of the p and/or n channel MOS transistors can be connected in parallel to obtain a desired transistor size.

DESCRIPTION OF PREFERRED EMBODIMENTS

In FIGS. 3 to 6, a semiconductor integrated circuit device according to the present invention includes an n type semiconductor substrate 100, a p type well 102 formed on a portion of a main surface of the substrate 100, a pair of n type regions $32b_1$ and $32b_2$ formed in parallel in the portion of the substrate surface, a pair of p type regions $32a_1$ and $32b_2$ formed parallel to each other and to the n type regions $32b_1$ and $32b_2$ on a portion of the substrate surface outside the p type well 102, a plurality of parallel gate electrodes 31a arranged above and orthogonally to the p type regions $32a_1$ and $32a_2$ to cover and bridge them, and a plurality of parallel gate electrodes 31b arranged above and orthogonally to the n type regions $32b_1$ and $32b_2$ to cover and bridge them. The p type regions $32a_1$ and $32a_2$ form source or drain regions of p type MOS transistors and n type regions $32b_1$ and $32b_2$ form source or drain regions of n type MOS transistors.

Figure 1:
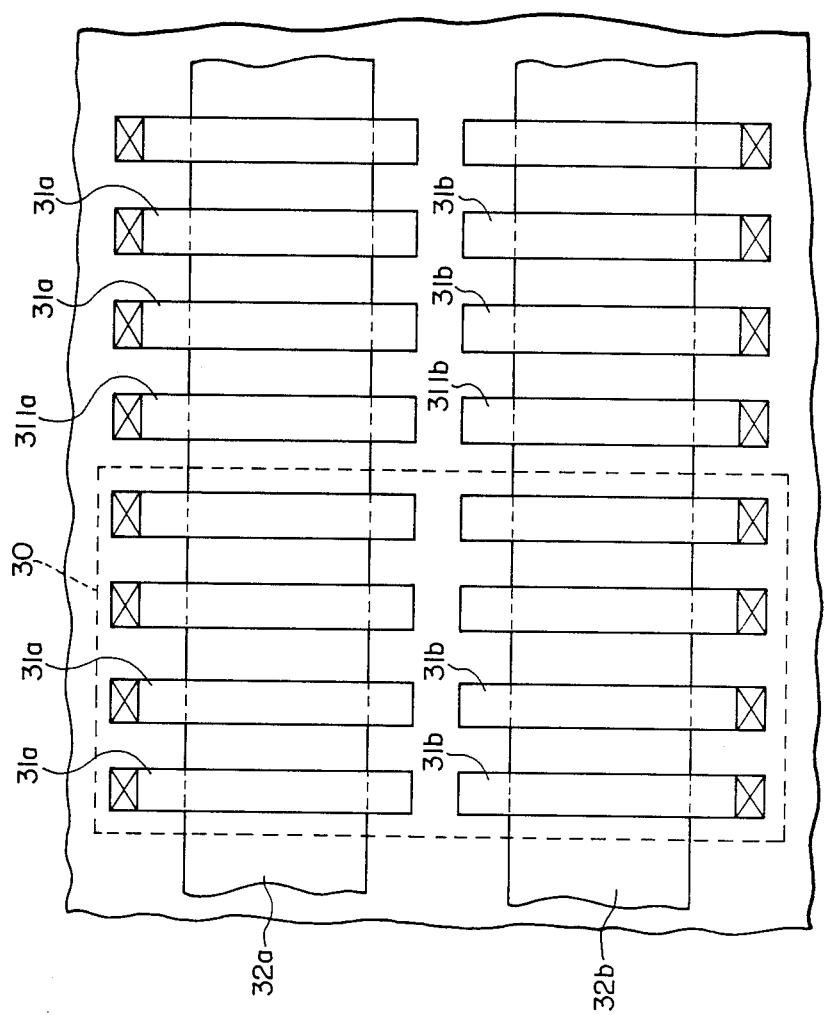
FIG. 1 shows an arrangement of a conventional semiconductor integrated circuit device of the master slice type.
Figure 2:
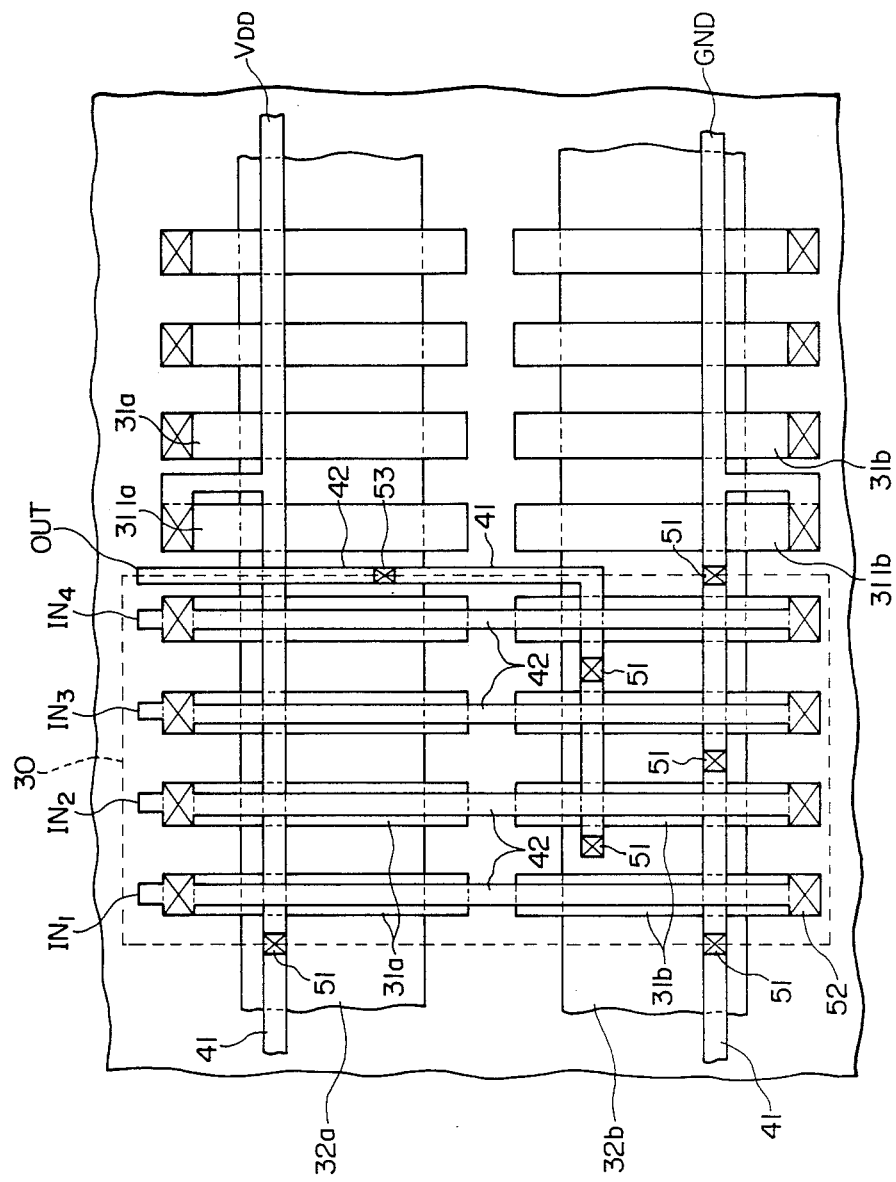
FIG. 2 depicts an arrangement of a four-input NOR gate constituted by the circuit device in FIG. 1.
Figure 3:
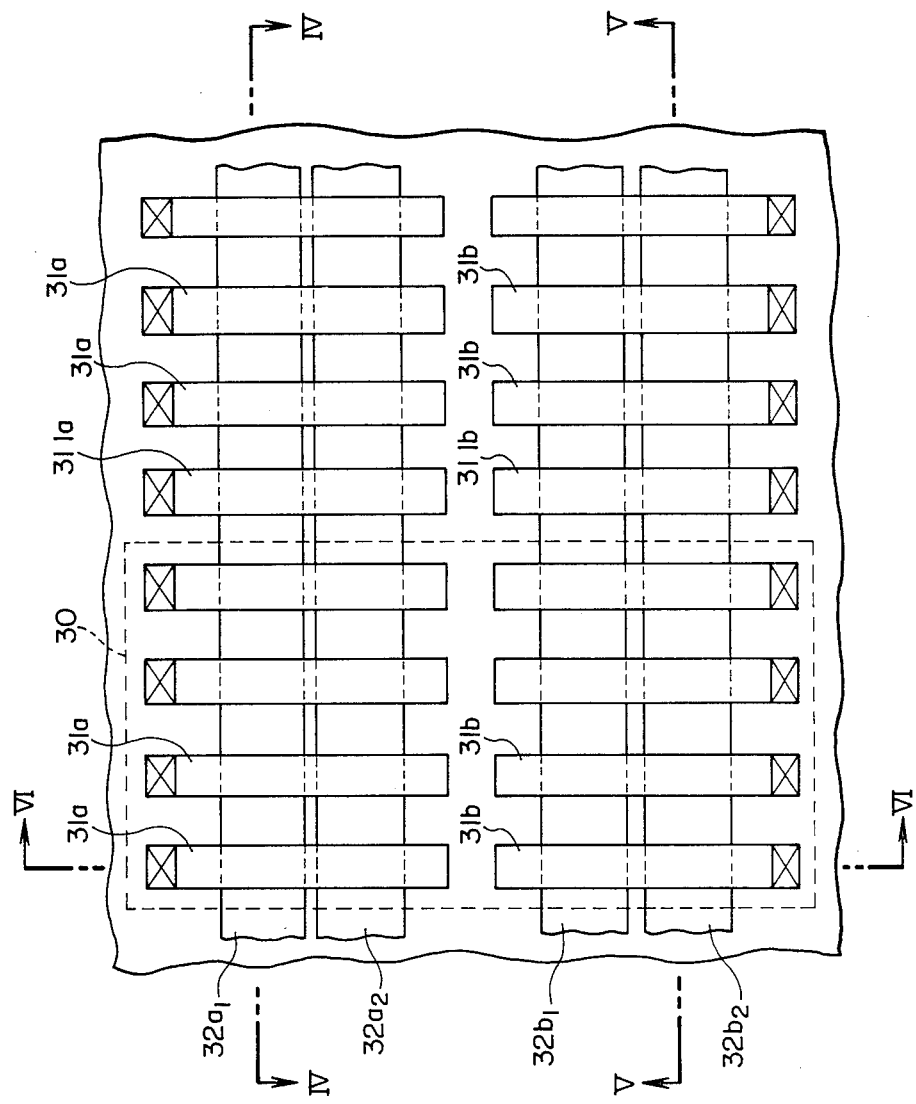
FIG. 3 shows an embodiment of the present invention.
Figure 4:
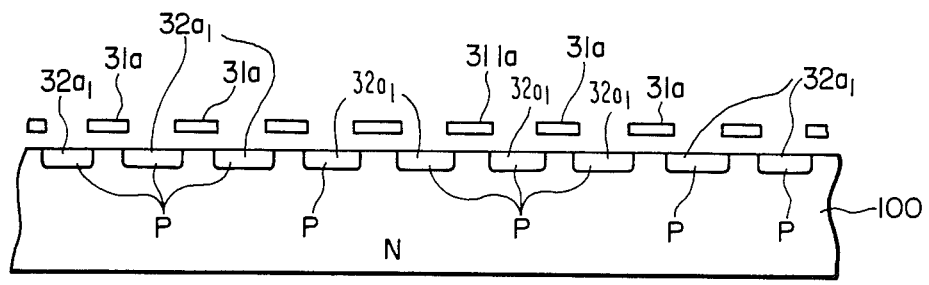
FIG. 4 is a cross-sectional view taken along a line IV—IV in FIG. 3.
Figure 5:
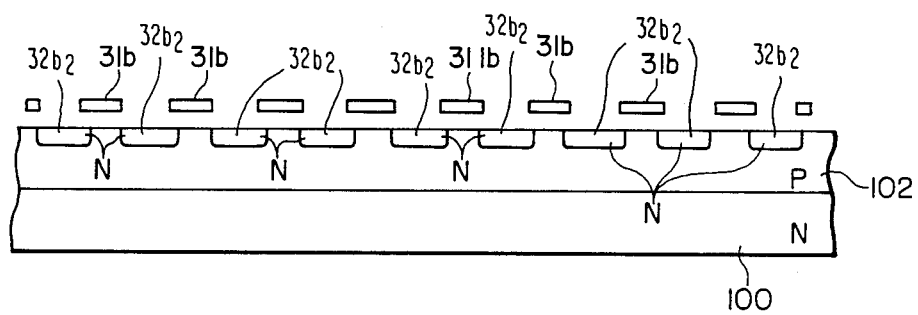
FIG. 5 is a cross-sectional view taken along a line V—V in FIG. 3.
Figure 6:
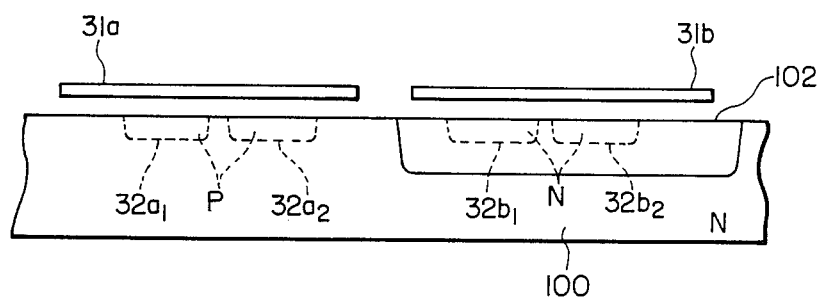
FIG. 6 is a cross-sectional view taken along a line VI—VI in FIG. 3.
Figure 7:
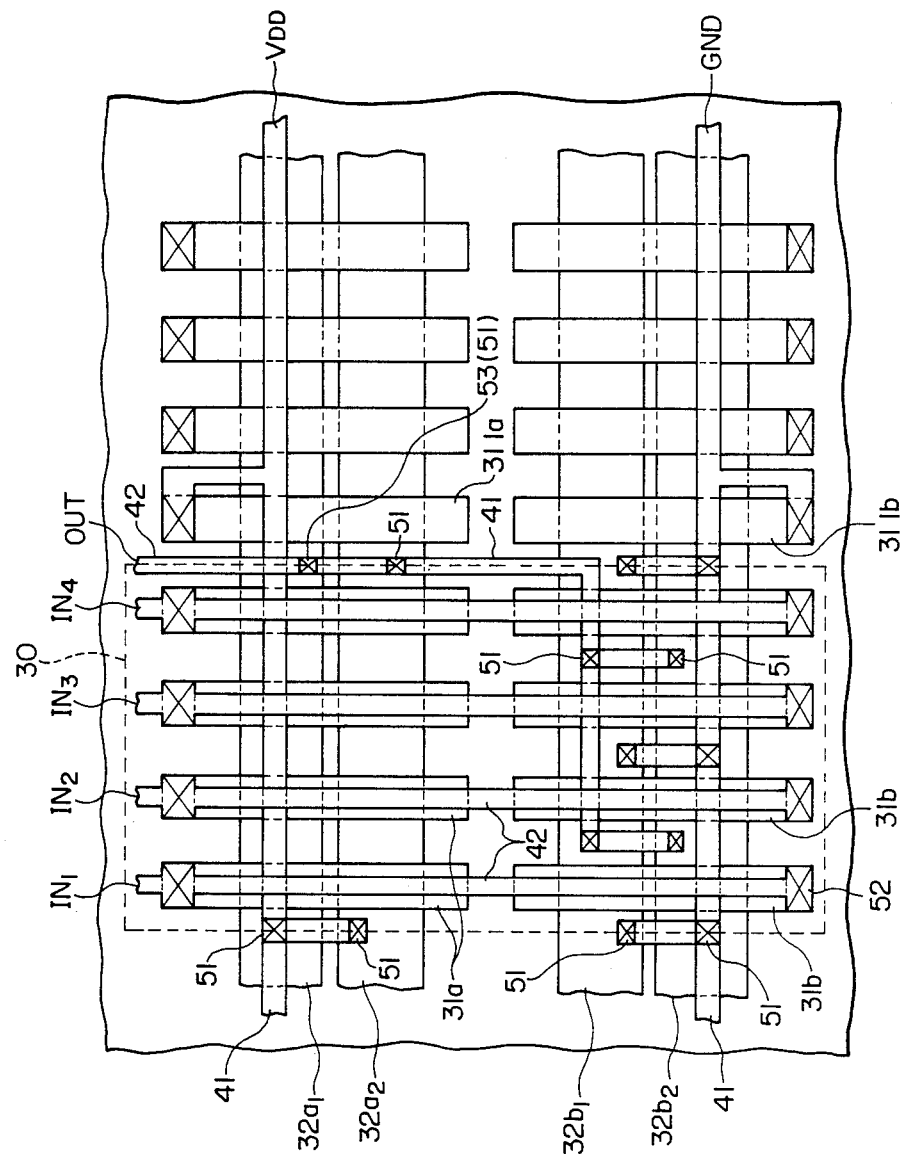
FIG. 7 shows a four-input NOR gate constituted by the circuit device in FIG. 3.

FIG. 7 shows a four-input NOR gate constituted by the circuit device in FIG. 3. Since FIG. 7 is similar to FIG. 2 except that the numbers of the wirings 41 and the contact holes 51 are increased in order to connect the paired p channel MOS transistors together and the paired n channel MOS transistors together, a further detailed description of FIG. 7 will not be required.

An application of the present circuit to an analog circuit will be described with reference to FIG. 8 which shows a bias generator circuit as an example of a basic analog circuit.

Figure 8:
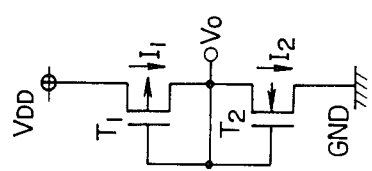
FIG. 8 is a circuit diagram of a bias generating circuit as an example of an analog circuit.

In FIG. 8, $T_1$ and $T_2$ depict a p channel MOS transistor and an n channel MOS transistor, respectively.

Assuming $V_{Tp} = V_{TH}$ of the p channel MOS transistor $T_1$,
$V_{Tn} = V_{TH}$ of the n channel MOS transistor $T_2$,
$\beta_p$ = conductance coefficient of $T_1$, and
$\beta_n$ = conductance coefficient of $T_2$, the important characteristics of this bias generation circuit can be expressed as follows.

$$I_1 = (\beta_p/2)(V_{PD} - V_0 - V_{Tp})^2, \text{ and}$$

$$I_2 = (\beta_n/2)(V_0 - V_{Tn})^2,$$

where $I_1$ and $I_2$ are currents flowing through $T_1$ and $T_2$, respectively, and $V_0$ and $V_{DD}$ are an output voltage of the circuit voltage and a source voltage, respectively. When it is desired to make $V_{TP} = V_{TN} = V_{TH}$ and to obtain $VC_0 = V_{DD}/2$, it is necessary for $I_1 = I_2$ and thus $\beta_p = \beta_n$.

However, since in the case of a gate array the size of the n channel MOS transistor is the same as that of the p channel MOS transistor, $\beta_n = (2-3) \times \beta_p$ due to the difference in mobility between electrons and holes.

Assuming $\beta_n = 2\beta_p$ and that the size of the p channel MOS transistor is unity, the size of the n channel MOS transistor is necessarily ½.

Figure 9:
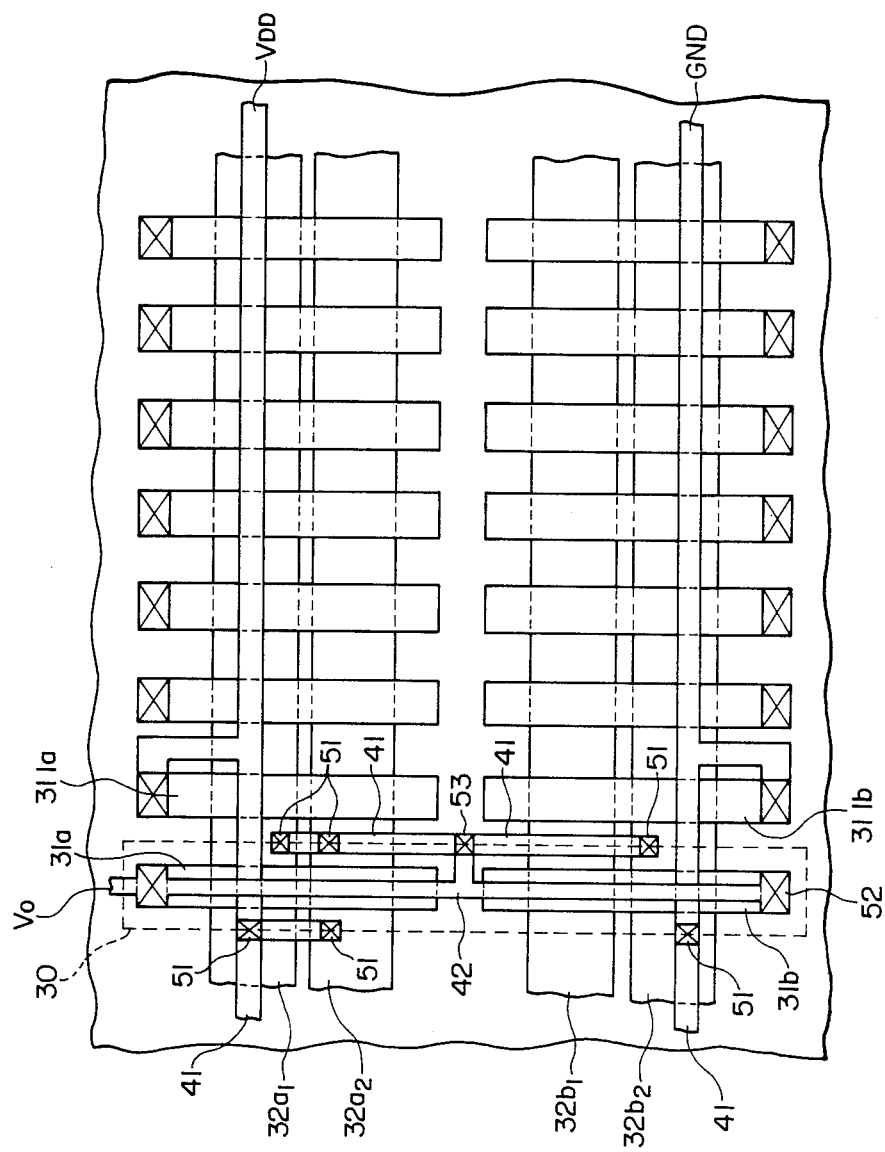
FIG. 9 shows a bias generating circuit constituted by the circuit device in FIG. 3.

FIG. 9 shows a biasing circuit realized using the circuit device according to the present invention, in which a cell 30 is constituted by a pair of p channel MOS and one of a pair of n channel MOS transistors. Gate regions 311a and 311b adjacent to the cell 30 are kept at the positive source potential and ground potential, respectively, to cut off the MOS transistors including the gate regions 311a and 311b to thereby isolate the cell 30 from them.

The sources of the paired p channel MOS transistors are connected to each other through a contact hole 51 and to a source voltage $V_{dd}$ through a portion of a first aluminum conductor layer 41, as shown in the upper left portions of FIG. 9, and a source of one of the paired n channel MOS transistors is connected through a contact hole 51 and another portion of the first aluminum conductor 41 to a grounding point GND, as shown in the lower left portion of FIG. 9. Drains of the paired p channel transistors and the n channel MOS transistor are connected to each other through contact holes 51, and a further portion of the first aluminum conductor 41 and the latter conductor is connected through a through-hole 53 to a second aluminum conductor layer 42 which connects the gate electrodes 31a and 31b of the p and n channel MOS transistors. Thus, the bias generation circuit shown in FIG. 8 is realized.

Although the circuit shown is constituted with a pair of p channel MOS transistors and one n channel MOS transistor (three MOS transistors in total), any number of p channel transistors and any number of n channel transistors can be combined to realize various analog circuits. That is, although the number of p or n channel MOS transistors whose gate electrodes are connected commonly is two in the described embodiment, any number may be used by increasing the number of p and/or n channel devices.

As described above, the circuit device of the present invention includes a plurality of parallel basic elements, each having a plurality of p channel MOS transistors having gate electrodes connected commonly and source or drain regions separated from each other, and a plurality of n channel MOS transistors having gate electrode connected commonly and source or drain regions separated from each other, the source or drain regions of the p and n channel MOS transistors arranged in corresponding positions of the basic elements being common. Therefore, an analog circuit can be constituted without using large-size transistors, and thus any increase of current can be avoided, resulting in a compact, inexpensive and low-power-consumption gate array.

I claim:

1. A semiconductor integrated circuit device comprising:

a plurality of first gate electrodes formed in a main surface of a semiconductor substrate and arranged parallel to one another, a plurality of first p type regions formed in said main surface of said semiconductor substrate below and orthogonal to said first gate electrodes, said first p type regions and said first gate electrodes forming a plurality of first p channel MOS transistors, a plurality of second p type regions formed in said main surface of said semiconductor substrate below and orthogonal to said first gate electrodes, said second p type regions being parallel to and separated from said first p type regions and forming, together with said first gate electrodes, a plurality of second p channel MOS transistors, said first gate electrodes covering and bridging said first and second p type regions, a plurality of second gate electrodes formed in said main surface of said semiconductor substrate and arranged parallel to one another and to said first gate electrodes, a plurality of first n type regions formed in said main surface of said semiconductor substrate below and orthogonal to said second gate electrodes, said first n type regions and said second gate electrodes forming a plurality of a first n channel MOS transistors, and a plurality of second n type regions formed parallel to and separate from said first n type regions in said main surface of said semiconductor substrate below and orthogonal to said second gate electrodes, said second n type regions forming, together with said second gate electrodes, a plurality of second n channel MOS transistors, said second gate electrodes covering and bridging said first and second n type regions.

2. The semiconductor integrated circuit device as claimed in claim 1, wherein said first and second p type regions form first and second common p regions, respectively, and said first and second n type regions form first and second common n regions, respectively.

3. A semiconductor integrated circuit device comprising:

a plurality of first p type regions formed in a main surface of a semiconductor substrate and arranged parallel to one another, a plurality of second p type regions formed in said main surface of said semiconductor substrate separately from and parallel to said first p type regions and arranged parallel to one another, a plurality of first common gate electrodes formed on said main surface of said semiconductor substrate and arranged parallel to one another, each of said first common gate electrodes being arranged between adjacent ones of said first p type regions and between adjacent ones of said second p type regions, a plurality of first n type regions formed in said main surface of said semiconductor substrate separately from said first and second p type regions and parallel to one another, a plurality of second n type regions formed in said main surface of said semiconductor substrate separately from and parallel to said first and second p type regions and said first n type regions and parallel to one another, a plurality of second parallel common gate electrodes formed on said main surface of said semiconductor substrate separately from said first parallel common gate electrodes, each of said second parallel common gate electrodes being arranged between adjacent ones of said first n type regions and between adjacent ones of said second n type regions, whereby adjacent ones of said first p type regions and one of said first common gate electrodes disposed between said adjacent first p type regions constitute a first p channel MOS transistor, adjacent ones of said second p type regions and said one of said first common gate electrodes constitute a second p channel MOS transistor, adjacent ones of said first n type regions and one of said second common gate electrodes disposed between said adjacent first n type regions constitute a first n channel MOS transistor, and adjacent ones of said second n type regions and said one of said second common gate electrodes constitute a second n channel MOS transistor.

* * * * *